(12) United States Patent
Kunitake

(10) Patent No.: US 12,014,942 B2
(45) Date of Patent: Jun. 18, 2024

(54) LEAK MEASUREMENT SYSTEM, SEMICONDUCTOR MANUFACTURING SYSTEM, AND LEAK MEASUREMENT METHOD

(71) Applicant: Tokyo Electron Limited, Tokyo (JP)

(72) Inventor: Yuta Kunitake, Iwate (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 697 days.

(21) Appl. No.: 17/064,861

(22) Filed: Oct. 7, 2020

(65) Prior Publication Data

US 2021/0104422 A1 Apr. 8, 2021

(30) Foreign Application Priority Data

Oct. 8, 2019 (JP) .................................. 2019-185454

(51) Int. Cl.
*H01L 21/00* (2006.01)
*G01H 9/00* (2006.01)
*H01L 21/67* (2006.01)

(52) U.S. Cl.
CPC ......... *H01L 21/67253* (2013.01); *G01H 9/00* (2013.01)

(58) Field of Classification Search
CPC ..... G01H 11/08; G01H 9/00; H01L 21/67253
See application file for complete search history.

(56) References Cited

U.S. PATENT DOCUMENTS

| 5,260,585 A | * | 11/1993 | Tom | G01N 27/12 |
| | | | | 250/573 |
| 2006/0174707 A1 | * | 8/2006 | Zhang | G01N 29/4418 |
| | | | | 700/282 |
| 2009/0229348 A1 | * | 9/2009 | Woo | G01N 21/68 |
| | | | | 73/40.5 R |
| 2019/0086311 A1 | * | 3/2019 | Nordstrom | F15C 3/00 |

FOREIGN PATENT DOCUMENTS

| JP | S61-8850 U | 1/1986 |
| JP | 2004-117077 A | 4/2004 |
| JP | 2008-032619 A | 2/2008 |
| JP | 2008-164462 A | 7/2008 |
| JP | 2010-203778 A | 9/2010 |
| KR | 10-2018-0113156 A | 10/2018 |
| KR | 20180113156 | * 10/2018 ....... H01L 21/67242 |

* cited by examiner

*Primary Examiner* — Mohamed Charioui
*Assistant Examiner* — Christine Y Liao
(74) *Attorney, Agent, or Firm* — Venjuris, P.C.

(57) ABSTRACT

A leak measurement system measures a leak of a semiconductor manufacturing apparatus. The leak measurement system includes a vibration sensor that contacts or is connected to the semiconductor manufacturing apparatus, an image generation unit that generates a vibration waveform image based on vibration data detected by the vibration sensor, and an analysis unit that analyzes the leak of the semiconductor manufacturing apparatus based on the vibration waveform image generated by the image generation unit.

18 Claims, 5 Drawing Sheets

LEAK MEASUREMENT SYSTEM, SEMICONDUCTOR MANUFACTURING SYSTEM, AND LEAK MEASUREMENT METHOD

CROSS-REFERENCE TO RELATED APPLICATION

This application is based on and claims priority from Japanese Patent Application No. 2019-185454 filed on Oct. 8, 2019 with the Japan Patent Office, the disclosure of which is incorporated herein in its entirety by reference.

TECHNICAL FIELD

The present disclosure relates to a leak measurement system, a semiconductor manufacturing system, and a leak measurement method.

BACKGROUND

A helium leak testing method is known as a leak testing method of confirming a leak of a semiconductor manufacturing apparatus (see, e.g., Japanese Patent Laid-Open Publication No. 2008-164462).

SUMMARY

A leak measurement system according to an aspect of the present disclosure measures a leak in a semiconductor manufacturing apparatus. The leak management system includes a vibration sensor that contacts or is connected to the semiconductor manufacturing apparatus, an image generation unit that generates a vibration waveform image based on vibration data detected by the vibration sensor, and an analysis unit that analyzes a leak of the semiconductor manufacturing apparatus based on the vibration waveform image generated by the image generation unit.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
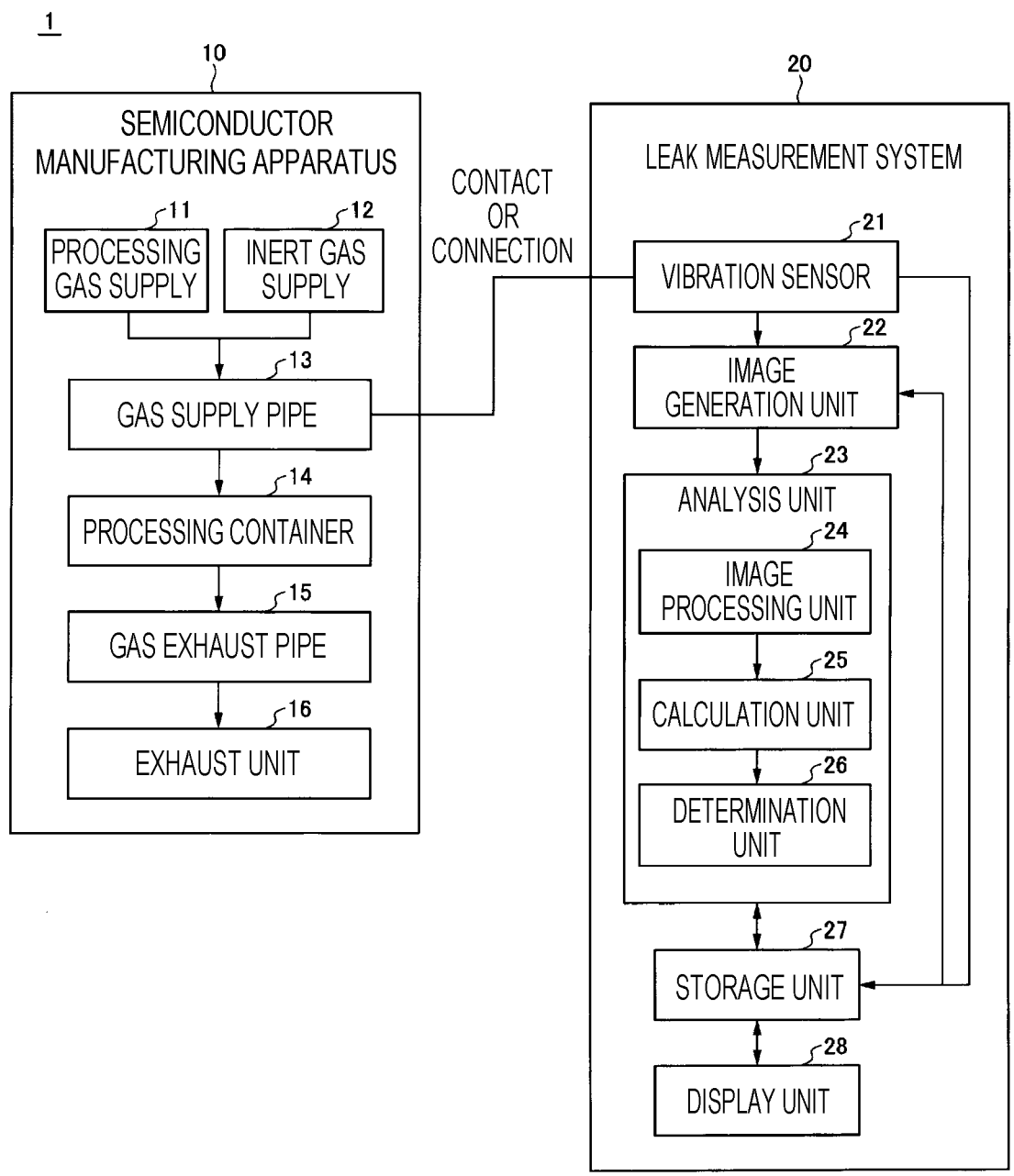
FIG. 1 is a diagram illustrating an example of a semiconductor manufacturing system according to an embodiment.

In the following detailed description, reference is made to the accompanying drawings, which form a part thereof. The illustrative embodiments described in the detailed description, drawings, and claims are not meant to be limiting. Other embodiments may be utilized, and other changes may be made without departing from the spirit or scope of the subject matter presented here.

Hereinafter, non-limiting embodiments of the present disclosure will be described with reference to the accompanying drawings. In the accompanying drawings, the same or corresponding members or parts are denoted by the same or corresponding reference numerals, and redundant explanations thereof are omitted.

[Semiconductor Manufacturing System]

FIG. 1 is a diagram illustrating an example of a semiconductor manufacturing system according to an embodiment. As illustrated in FIG. 1, the semiconductor manufacturing system 1 includes a semiconductor manufacturing apparatus 10 and a leak measurement system 20 that measures a leak of the semiconductor manufacturing apparatus 10.

The semiconductor manufacturing apparatus 10 performs a predetermined process such as a film forming process or an etching process on a substrate such as a semiconductor wafer or a flat panel display (FPD) substrate. The semiconductor manufacturing apparatus 10 may be a single-wafer type apparatus that processes substrates one by one, or a batch type apparatus that processes a plurality of substrates at once. The semiconductor manufacturing apparatus 10 includes a processing gas supply 11, an inert gas supply 12, a gas supply pipe 13, a processing container 14, a gas exhaust pipe 15, and an exhaust unit 16. Further, the semiconductor manufacturing apparatus 10 may include a heating mechanism and a cooling mechanism which are not illustrated.

The processing gas supply 11 is connected to the processing container 14 via the gas supply pipe 13 and supplies a processing gas into the processing container 14 via the gas supply pipe 13. The processing gas supply 11 supplies the processing gas into the processing container 14 via the gas supply pipe 13 when performing a predetermined process on, for example, the substrate accommodated in the processing container 14. The processing gas is selected according to a predetermined process. For example, when the predetermined process is a process of forming a silicon oxide film, a silicon-containing gas such as dichlorosilane (DCS) gas and an oxidizing gas such as ozone ($O_3$) gas may be used as the processing gas.

The inert gas supply 12 is connected to the processing container 14 via the gas supply pipe 13, and supplies the inert gas into the processing container 14 via the gas supply pipe 13. The inert gas supply 12 supplies the inert gas into the processing container 14 via the gas supply pipe 13, for example, when performing a purge process of replacing and removing the processing gas remaining in the processing container 14. Further, when the leak measurement system 20 determines whether there is a leak in each unit of the semiconductor manufacturing apparatus 10 (e.g., the gas supply pipe 13, the processing container 14, and the gas exhaust pipe 15), the inert gas supply 12 supplies an inert gas into the processing container 14 via the gas supply pipe 13. The inert gas may be, for example, nitrogen ($N_2$) gas or argon (Ar) gas.

The gas supply pipe 13 connects the processing gas supply 11, the inert gas supply 12, and the processing container 14. One end of the gas supply pipe 13 is connected to the gas pipes of the processing gas supply 11 and the inert gas supply 12, for example, by a joint. The other end of the gas supply pipe 13 is connected to a gas nozzle (injector) for supplying the processing gas and the inert gas into the processing container 14, for example, by a joint. A valve, a flow rate controller (e.g., a mass flow controller), and a pressure controller (e.g., a regulator) are provided in the gas supply pipe 13 using a joint. The joint may be, for example, a gasket joint.

The processing container 14 is a container whose inside may be depressurized. The processing container 14 accommodates one or a plurality of substrates inside. In the processing container 14, the processing gas is supplied from the processing gas supply 11 to perform a predetermined process on the substrate.

The gas exhaust pipe 15 connects the processing container 14 and the exhaust unit 16. One end of the gas exhaust pipe 15 is connected to an exhaust port of the processing container 14, for example, by a joint. The other end of the gas exhaust pipe 15 is connected to the exhaust unit 16, for example, by a joint. A valve (e.g., a butterfly valve) is provided in the gas exhaust pipe 15 using a joint.

The exhaust unit 16 is connected to the processing container 14 through the gas exhaust pipe 15, and the inside of the processing container 14 is depressurized by exhausting the inside of the processing container 14 through the gas exhaust pipe 15. The exhaust unit 16 includes, for example, a vacuum pump.

The leak measurement system 20 measures the leak of the semiconductor manufacturing apparatus 10. The leak measurement system 20 includes a vibration sensor 21, an image generation unit 22, an analysis unit 23, a storage unit 27, and a display unit 28. The image generation unit 22, the analysis unit 23, the storage unit 27, and the display unit 28 are implemented by, for example, a computer.

The vibration sensor 21 is detachably attached to (hereinafter, referred to as "contacts") the joint of the gas supply pipe 13 or fixed to (hereinafter, referred to as "connected to") the joint of the gas supply pipe 13, and detects the vibration of the gas flowing through the gas supply pipe 13. The type of the vibration sensor 21 is not particularly limited, but, for example, a piezoelectric sensor may be used. The measurement frequency range of the vibration sensor 21 may be, for example, 100 kHz to 950 Hz. An amplifier (not illustrated) that amplifies the detected vibration (hereinafter, referred to as "vibration data") may be attached to the vibration sensor 21. The gain of the amplifier may be, for example, 20 dB to 60 dB.

The image generation unit 22 generates a vibration waveform image based on the vibration data detected by the vibration sensor 21. The image generation unit 22 generates a vibration waveform image by, for example, performing a fast Fourier transform (FFT) analysis on the vibration data. Further, when the vibration data is in an analog value, after a measurement unit (not illustrated) discretizes and processes the vibration data as digital data, the image generation unit 22 generates a vibration waveform image based on the vibration data processed into digital data.

Figure 2A:
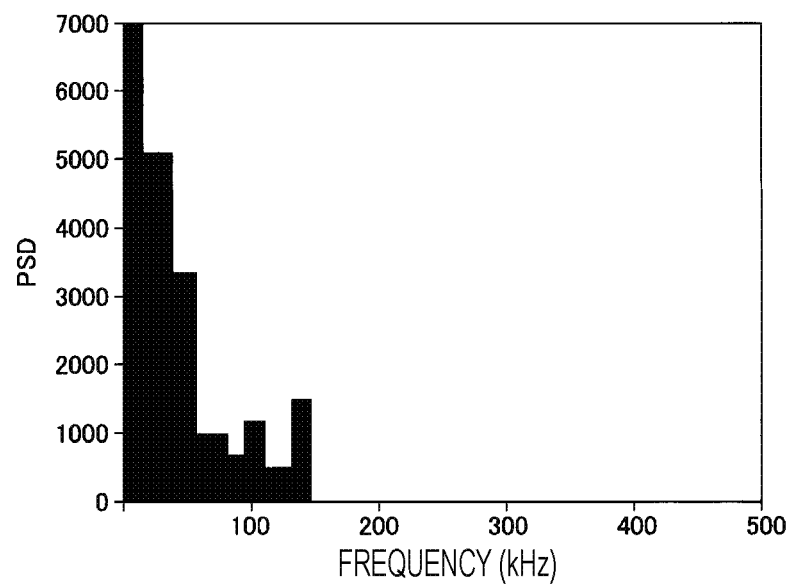
FIGS. 2A and 2B are diagrams illustrating an example of a vibration waveform image.
Figure 2B:
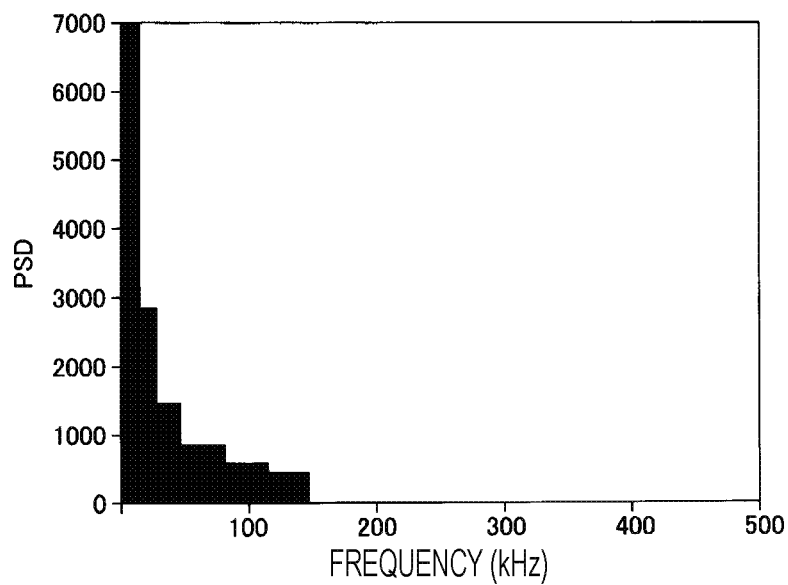

FIGS. 2A and 2B are diagrams illustrating an example of the vibration waveform image, which is generated based on the vibration data detected by the vibration sensor 21 in a state where the gas supply pipe 13 is supplied with an inert gas to pressurize the inside of the gas supply pipe 13.

FIG. 2A is a diagram illustrating an example of a vibration waveform image generated based on the vibration data detected by the vibration sensor 21 in a state where there is no leakage. FIG. 2A illustrates, as a vibration waveform image, a vibration waveform image that is obtained by the FFT analysis of vibration data detected in a state where the joint of the gas supply pipe 13 is manually tightened and then tightened by 60 degrees. However, the vibration waveform image generated based on the vibration data detected by the vibration sensor 21 in the non-leakage state may be, for example, an image generated based on the vibration data detected by the vibration sensor 21 in a state where the inert gas is not supplied to the gas supply pipe 13.

FIG. 2B is a diagram illustrating an example of a vibration waveform image generated based on the vibration data detected by the vibration sensor 21 in the state where the leak is desired to be measured. FIG. 2A illustrates, as a vibration waveform image, a vibration waveform image that is obtained by the FFT analysis of vibration data detected in a state where the joint of the gas supply pipe 13 is manually tightened and then tightened by 10 degrees. Further, in FIGS. 2A and 2B, the horizontal axis represents a frequency [kHz], and the vertical axis represents a power spectral density (PSD).

The analysis unit 23 analyzes the leak of the gas supply pipe 13 based on the vibration waveform image generated by the image generation unit 22. The analysis unit 23 includes an image processing unit 24, a calculation unit 25, and a determination unit 26.

The image processing unit 24 generates a difference image of the two vibration waveform images generated by the image generating unit 22. One of the two vibration waveform images is, for example, an image generated based on the vibration data detected by the vibration sensor 21 in a state where there is no leak. The other of the two vibration waveform images is, for example, an image generated based on the vibration data detected by the vibration sensor 21 in a state where leakage is desired to be measured. The image processing unit 24, for example, acquires one of the two vibration waveform images from the storage unit 27, acquires the other of the two vibration waveform images from the image generation unit 22, and generates a difference image based on the acquired two vibration waveform images.

Figure 3:
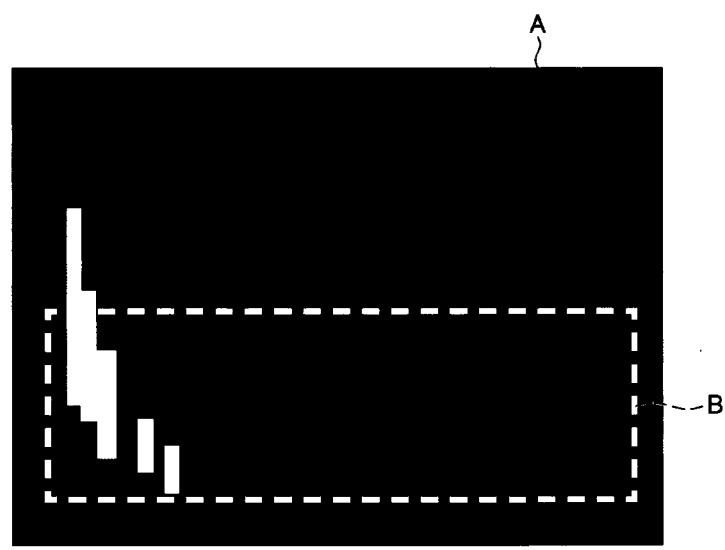
FIG. 3 is a diagram illustrating an example of a difference image.

FIG. 3 is a diagram illustrating an example of a difference image. As illustrated in FIG. 3, in the difference image, the matching area in the two vibration waveform images is indicated in black, and the non-matching area is indicated in white.

In addition, when the vibration waveform image is a color image, the image processing unit 24 converts the color image into a grayscale image by a grayscale process, converts the grayscale image into a binary image by a binarization process, and then generates a difference image based on the binary image. Further, when the vibration waveform image is a grayscale image, the image processing unit 24 converts the grayscale image into a binary image by a binarization process and then generates a difference image based on the binary image.

The calculation unit 25 calculates a difference ratio based on the difference image generated by the image processing unit 24. The calculation unit 25 calculates, for example, the ratio of the white area to an entire area of the difference image generated by the image processing unit 24 (see the area A in FIG. 3) as the difference ratio. However, the calculation unit 25 may extract, for example, a partial area of the difference image generated by the image processing unit 24 (see the area B in FIG. 3) to calculate the ratio of the white area included in the partial area B to the partial area B as the difference ratio.

The determination unit 26 determines whether there is a leak in the gas supply pipe 13 based on the difference ratio calculated by the calculation unit 25. The determination unit 26 determines the presence/absence of a leak, for example, by comparing the difference ratio calculated by the calculation unit 25 with a predetermined threshold value. Specifically, the determination unit 26 determines that there is "no leak" when the difference ratio calculated by the calculation unit 25 is less than or equal to a threshold value, and that there is a "leak" when the difference ratio calculated by the calculation unit 25 is greater than the threshold value. The threshold value may be a value determined by, for example, preliminary experiments.

The storage unit 27 stores the vibration data detected by the vibration sensor 21, the vibration waveform image generated by the image generation unit 22, and the analysis result of the leak analyzed by the analysis unit 23.

The display unit 28 displays the vibration data detected by the vibration sensor 21, the vibration waveform image generated by the image generation unit 22, and the analysis result of the leak analyzed by the analysis unit 23. The display unit 28 may display all or a part of the vibration data, the vibration waveform image, and the analysis result of the leak.

Figure 4:
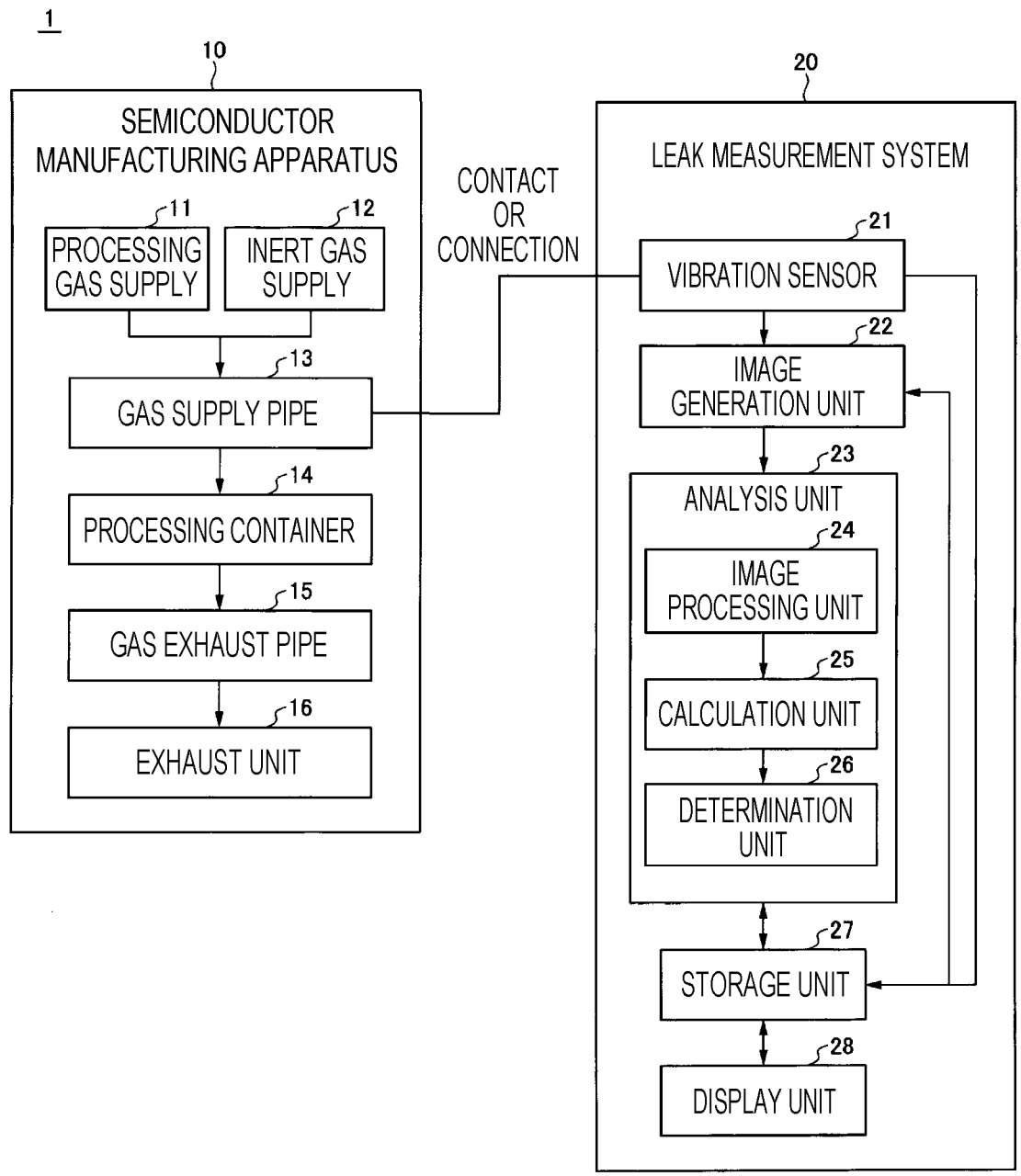
FIG. 4 is a diagram illustrating another example of the semiconductor manufacturing system according to the embodiment.

The example of FIG. 1 illustrates the case where the vibration sensor 21 is in contact with or connected to the joint of the gas supply pipe 13d, but the position where the vibration sensor 21 is contacted or connected is not limited thereto. For example, as illustrated in FIG. 4, the vibration sensor 21 may be in contact with or connected to the gas exhaust pipe 15. However, from the viewpoint of increasing the accuracy of determining the presence/absence of a leak, it is preferable that the vibration sensor 21 is in contact with or connected to a position in the semiconductor manufacturing apparatus 10 where the presence/absence of a leak is to be determined or in the vicinity thereof.

[Leak Measurement Method]

A leak measurement method according to an embodiment will be described. The leak measurement method according to the embodiment is a method of measuring a leak in the gas supply pipe 13, the processing container 14, or the gas exhaust pipe 15 when the semiconductor manufacturing apparatus 10 is newly introduced or after the semiconductor manufacturing apparatus 10 is maintained. The leak measurement method according to the embodiment is performed, for example, in a state where the vibration sensor 21 is in contact with or connected to a position in the semiconductor manufacturing apparatus 10 where leak is to be measured or the vicinity thereof, and in a state in which the inside of the gas supply pipe 13 is pressurized by supplying an inert gas from the inert gas supply 12 to the gas supply pipe 13. The supply of the inert gas from the inert gas supply 12 to the gas supply pipe 13 may be manually performed by an operator, or may be automatically performed by the leak measurement system 20 by controlling the processing gas supply 11.

Figure 5:
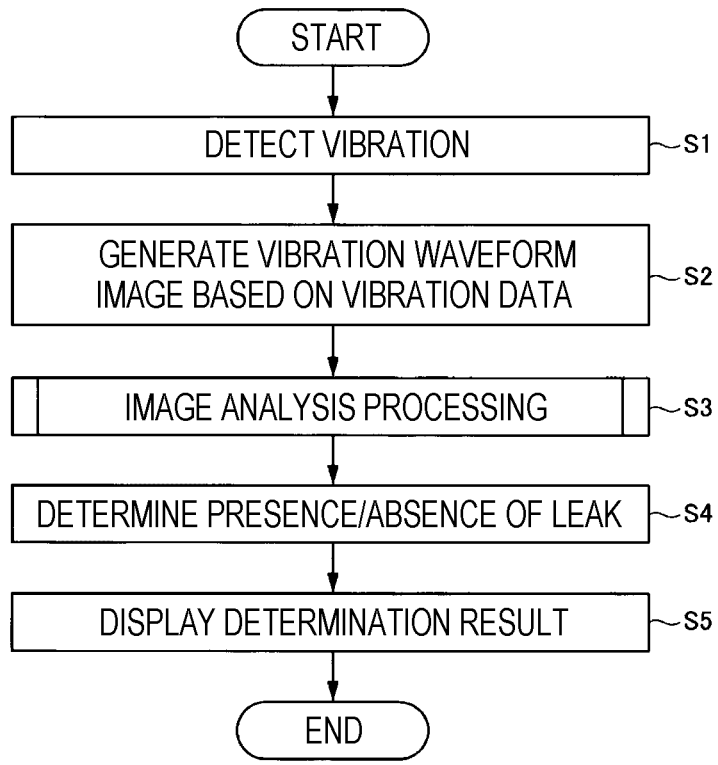
FIG. 5 is a flowchart illustrating a leak measurement method according to the embodiment.

Hereinafter, with reference to FIG. 5, a case of measuring the leak of the gas supply pipe 13 in the semiconductor manufacturing apparatus 10 will be described as an example. FIG. 5 is a flowchart illustrating a leak measurement method according to the embodiment.

First, when the operator performs a leak measurement operation in a state where the vibration sensor 21 is in contact with or connected to the gas supply pipe 13, the leak measurement system 20 controls the inert gas supply 12 to supply the inert gas from the inert gas supply 12 to the gas supply pipe 13. As a result, the inside of the gas supply pipe 13 is pressurized. Then, the following steps S1 to S5 are executed.

In the step S1, the vibration sensor 21 detects the vibration of the gas flowing through the gas supply pipe 13. The vibration of gas detected by the vibration sensor 21 is stored in the storage unit 27 as vibration data.

In the step S2, the image generation unit 22 generates a vibration waveform image based on the vibration data detected in the step S1. The vibration waveform image generated by the image generation unit 22 is stored in the storage unit 27.

In the step S3, the image processing unit 24 and the calculation unit 25 perform an image analysis process using the vibration waveform image generated in the step S2. The analysis result of the image analysis process is stored in the storage unit 27. The image analysis process will be described later.

In the step S4, the determination unit 26 determines whether there is a leak in the gas supply pipe 13 based on the analysis result obtained by the image analysis process in the step S3. In the embodiment, the determination unit 26 determines whether there is a leak in the gas supply pipe 13 based on the difference ratio calculated by the calculation unit 25. The determination unit 26 determines the presence/absence of a leak, for example, by comparing the difference ratio calculated by the calculation unit 25 with a predetermined threshold value.

In the step S5, the display unit 28 displays information regarding the presence/absence of a leak in the gas supply pipe 13, which is a determination result made by the determination unit 26 in the step S4. Further, in addition to the information regarding the presence/absence of leak, the display unit 28 may display at least one of the vibration data stored in the storage unit 27 in the step S1, the vibration waveform image stored in the storage unit 27 in the step S2, and the analysis result stored in the storage unit 27 in the step S3.

[Image Analysis Process]

Figure 6:
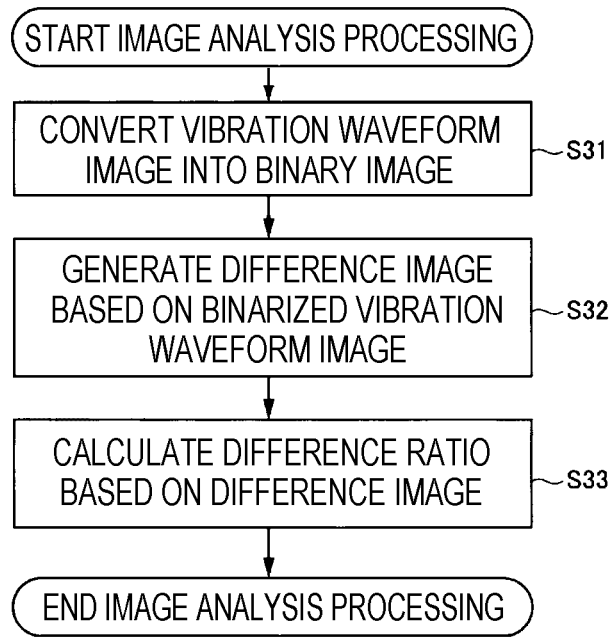
FIG. 6 is a flowchart illustrating an example of an image analysis process.

An example of the image analysis process executed in the leak measurement method according to the embodiment will be described. FIG. 6 is a flowchart illustrating an example of the image analysis process.

In a step S31, the image processing unit 24 converts the color image into a grayscale image by a grayscale conversion process and the grayscale image into a binary image by a binarization process for the vibration waveform image generated in the step S2. However, when the vibration waveform image is a grayscale image, only the binarization process needs to be performed, and the grayscale conversion process may be omitted. Further, when the vibration waveform image is a binary image, the step S31 (the grayscale conversion process and the binarization process) may be omitted.

In a step S32, the image processing unit 24 generates a difference image based on the binarized vibration waveform image (binary image) stored in the storage unit 27 prior to executing the leak measurement method and the binarized vibration waveform image (binary image) in the step S31. The binary image stored in the storage unit 27 prior to executing the leak measurement method is a reference image to be compared, and may be, for example, a vibration waveform image that is generated based on the vibration data detected by the vibration sensor 21 in a non-leaking state. The difference image generated by the image processing unit 24 is stored in the storage unit 27.

In a step S33, the calculation unit 25 calculates the difference ratio based on the difference image generated by the image processing unit 24 in the step S32. The difference ratio calculated by the calculation unit 25 is stored in the storage unit 27.

Embodiment

Descriptions will be made on an example in which the presence or absence of a leak in the gas supply pipe 13 is determined by the leak measurement method according to the embodiment. In the example, the presence/absence of leakage is determined when the tightening amount of the gasket joint, which is a connection portion of the gas pipe in the gas supply pipe 13, is changed. Specifically, the leak measurement is performed by the above-described leak measurement method for each of the cases where the gasket joint is manually tightened and then tightened at a predetermined angle (10 degrees, 20 degrees, 30 degrees, 40 degrees, or 50 degrees). In the example, the vibration of the gas in the gas supply pipe 13 is detected in a state where the vibration sensor 21 is in contact with the gasket joint. Further, the difference ratio is calculated based on the vibration waveform image generated based on the vibration data detected by the vibration sensor 21 in a state where $N_2$ gas is supplied to the gas supply pipe 13 to pressurize the inside of the gas supply pipe 13.

For comparison, the leak rate is measured by the helium leak testing method for each of the cases where the gasket joint is manually tightened and then tightened at a predetermined angle (10 degrees, 20 degrees, 30 degrees, 40 degrees, or 50 degrees).

Table 1 below represents the difference ratio [%] calculated by the leak measurement method according to the embodiment and the leak rate [Pa·m$^3$/sec] calculated by the helium leak testing method.

TABLE 1

| | Tightening Angle of Joint [Degrees] | | | | |
|---|---|---|---|---|---|
| | 10 | 20 | 30 | 40 | 50 |
| Difference Ratio [%] | 24.28 | 24.99 | 26.11 | 14.62 | 13.90 |
| Leak Rate of He Leak Detector [Pa · m$^3$/sec] | 1.7E−07 | 1.1E−10 | 2.9E−11 | — | — |

※ "—" indicates that the leak rate is below the detection limit of the He leak detector.

As represented in Table 1, by setting the tightening angle of the gasket joint to 40 degrees or more, the difference ratio calculated by the leak measurement method according to the embodiment is significantly reduced as compared with the case of the gasket joint tightened to 30 degrees or less. Further, by setting the tightening angle of the gasket joint to 40 degrees or more, the leak rate of the helium leak detector is below the detection limit, that is, no leak occurs. From these results, in the leak measurement method according to the embodiment, it may be said that the presence/absence of a leak in the gas supply pipe 13 may be determined with the same accuracy as the helium leak testing method by setting the threshold value of the difference ratio to, for example, 20%.

As described above, in the embodiment, the vibration waveform image is generated based on the vibration data detected by the vibration sensor 21 that is in contact with or connected to the semiconductor manufacturing apparatus 10, and the leak of the semiconductor manufacturing apparatus 10 is analyzed based on the vibration waveform image. Since the vibration sensor is small, it is possible to construct a leak measurement system that is significantly more compact than that using a detector (helium leak detector) in, for example, the helium leak testing method. That is, the leak of the semiconductor manufacturing apparatus 10 may be measured more simply and easily. For example, it is possible to increase convenience by making it a size capable of measuring leak while carrying the semiconductor manufacturing apparatus 10.

Further, in the embodiment, the vibration sensor 21 detects the vibration of the gas in the gas supply pipe 13 while the inert gas is supplied to pressurize the inside of the gas supply pipe 13. As a result, it is not necessary to depressurize (evacuate) the inside of the gas supply pipe 13 so that the time required for leak measurement may be shortened. In the reduced pressure leak measurement method such as the helium leak testing method, since the time required for evacuation and the preparation of the detector is long, the time required for the leak measurement is long.

Further, in the embodiment, since the presence/absence of a leak is determined using a difference image generated based on two vibration waveform images, even when the vibration waveform image includes noise, the noise is removed when the difference image is generated. This is because noise appears in the same frequency band regardless of the presence or absence of leak. In this way, since noise may be removed without performing a complicated statistical processing method or filtering process by determining the presence/absence of a leak by using a difference image generated based on two vibration waveform images, it is possible to reduce the calculation man-hour until the determination result of the presence or absence of leak is obtained.

In addition, in the embodiment, since the determination result of the presence/absence of the leak is displayed on the display unit 28, the operator may easily recognize the presence/absence of the leak by checking the display unit 28. For example, the operator recognizes that there is a leak by checking the display unit 28, and refastens the joint of the gas supply pipe 13.

According to the present disclosure, it is possible to more simply and easily measure a leak in a semiconductor manufacturing apparatus.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A leak measurement system comprising:
   a vibration sensor that contacts or is connected to a semiconductor manufacturing apparatus;
   an imaging circuitry that generates a vibration waveform image based on vibration data detected by the vibration sensor; and
   an analyzing circuitry that analyzes a gas leak of the semiconductor manufacturing apparatus based on the vibration waveform image generated by the imaging circuitry, thereby measuring the gas leak of the semiconductor manufacturing apparatus based on vibration,
   wherein the analyzing circuitry includes:
      an image processing circuitry that generates a difference image of two vibration waveform images generated by the imaging circuitry;
      a calculation circuitry that calculates a difference ratio based on the difference image generated by the image processing circuitry; and
      a determination circuitry that determines whether there is a leak in the semiconductor manufacturing apparatus based on the difference ratio calculated by the calculation circuitry, and the difference ratio is calculated by a ratio of a non-matching area in the two vibration waveform images to an entire area of the difference image.

2. The leak measurement system according to claim 1, wherein one of the two vibration waveform images is generated based on the vibration data detected by the vibration sensor in a state where there is no leak in the semiconductor manufacturing apparatus.

3. The leak measurement system according to claim 2, wherein one of the two vibration waveform images is generated based on the vibration data detected by the vibration sensor in a state where an inert gas is not supplied to the semiconductor manufacturing apparatus.

4. The leak measurement system according to claim 3, wherein a remaining one of the two vibration waveform images is generated based on the vibration data detected by the vibration sensor in a state where the leak of the semiconductor manufacturing apparatus is to be measured.

5. The leak measurement system according to claim 4, wherein the remaining one of the two vibration waveform images is generated based on the vibration data detected by the vibration sensor in a state where an inert gas is supplied to the semiconductor manufacturing apparatus to pressurize an inside of the semiconductor manufacturing apparatus.

6. The leak measurement system according to claim 5, wherein the determination circuitry determines a presence or absence of the leak by comparing the difference ratio calculated by the calculation circuitry with a predetermined threshold value.

7. The leak measurement system according to claim 6, wherein the imaging circuitry generates the vibration waveform image by performing an FFT analysis on the vibration data.

8. The leak measurement system according to claim 7, further comprising:
a display that displays an analysis result of the leak analyzed by the analyzing circuitry.

9. The leak measurement system according to claim 7, further comprising:
a storage that stores the vibration data detected by the vibration sensor, the vibration waveform image generated by the imaging circuitry, and the analysis result of the leak analyzed by the analyzing circuitry.

10. The leak measurement system according to claim 1, wherein one of the two vibration waveform images is generated based on the vibration data detected by the vibration sensor in a state where an inert gas is not supplied to the semiconductor manufacturing apparatus.

11. The leak measurement system according to claim 1, wherein a remaining one of the two vibration waveform images is an image generated based on the vibration data detected by the vibration sensor in a state where the leak of the semiconductor manufacturing apparatus is to be measured.

12. The leak measurement system according to claim 1, wherein a remaining one of the two vibration waveform images is an image generated based on the vibration data detected by the vibration sensor in a state where an inert gas is supplied to the semiconductor manufacturing apparatus to pressurize an inside of the semiconductor manufacturing apparatus.

13. The leak measurement system according to claim 1, wherein the determination circuitry determines a presence or absence of the leak by comparing the difference ratio calculated by the calculation circuitry with a predetermined threshold value.

14. The leak measurement system according to claim 1, wherein the imaging circuitry generates the vibration waveform image by performing an FFT analysis on the vibration data.

15. The leak measurement system according to claim 1, further comprising:
a display that displays an analysis result of the leak analyzed by the analyzing circuitry.

16. The leak measurement system according to claim 1, further comprising:
a storage that stores the vibration data detected by the vibration sensor, the vibration waveform image generated by the imaging circuitry, and the analysis result of the leak analyzed by the analyzing circuitry.

17. A semiconductor manufacturing system comprising:
a semiconductor manufacturing apparatus;
a vibration sensor that contacts or is connected to the semiconductor manufacturing apparatus;
an imaging circuitry that generates a vibration waveform image based on vibration data detected by the vibration sensor; and
an analyzing circuitry that analyzes a gas leak of the semiconductor manufacturing apparatus based on the vibration waveform image generated by the imaging circuitry, thereby analyzing the gas leak of the semiconductor manufacturing apparatus based on vibration,
wherein the analyzing circuitry includes:
an image processing circuitry that generates a difference image of two vibration waveform images generated by the imaging circuitry;
a calculation circuitry that calculates a difference ratio based on the difference image generated by the image processing circuitry; and
a determination circuitry that determines whether there is a leak in the semiconductor manufacturing apparatus based on the difference ratio calculated by the calculation circuitry, and
the difference ratio is calculated by a ratio of a non-matching area in the two vibration waveform images to an entire area of the difference image.

18. A leak measurement method of measuring a leak of a semiconductor manufacturing apparatus, the method comprising:
generating a vibration waveform image based on vibration data detected by a vibration sensor that contacts or is connected to the semiconductor manufacturing apparatus; and
analyzing a gas leak of the semiconductor manufacturing apparatus based on the vibration waveform image generated in the generating of the vibration waveform image, thereby measuring the gas leak of the semiconductor manufacturing apparatus based on vibration,
wherein the analyzing of the gas leak of the semiconductor manufacturing apparatus includes:
generating a difference image of two vibration waveform images generated in the generating of the vibration waveform image;
calculating a difference ratio based on the difference image; and
determining whether there is a leak in the semiconductor manufacturing apparatus based on the difference ratio, and
the difference ratio is calculated by a ratio of a non-matching area in the two vibration waveform images to an entire area of the difference image.

* * * * *